United States Patent [19]

Gruen et al.

[11] 4,278,890
[45] Jul. 14, 1981

[54] METHOD AND MEANS OF DIRECTING AN ION BEAM ONTO AN INSULATING SURFACE FOR ION IMPLANTATION OR SPUTTERING

[75] Inventors: Dieter M. Gruen, Downers Grove; Alan R. Krauss, Naperville; Barry Siskind, Downers Grove, all of Ill.

[73] Assignee: The United States of America as represented by the United States Department of Energy, Washington, D.C.

[21] Appl. No.: 812,936

[22] Filed: Jul. 1, 1977

[51] Int. Cl.$^3$ .......................... G21K 5/04; C23C 15/00
[52] U.S. Cl. ................................. 250/492 B; 204/298
[58] Field of Search ........... 204/192 R, 192 C, 192 D, 204/298; 118/49.1; 427/38; 250/492 A, 492 B

[56] References Cited

U.S. PATENT DOCUMENTS 3,472,751   10/1969   King ..................................... 204/192

OTHER PUBLICATIONS

A. J. Weigand et al., "Ion–Beam–Sputter Modification of the Surface Morphology of Biological Implants," *J. Vac. Sci. Tech.*, vol. 14, pp. 326–331 (1977).
R. G. Wilson et al., "Ion Beams–With Applications to Ion Implantation," J. Wiley & Sons, (1973), p. 320.
G. Carter et al., "Ion Implantation of Semiconductors," J. Wiley & Sons (1976), pp. 2–3.
G. Dearnaley et al., "Ion Implantation," North Holland Publishing Co. (1973), pp. 416–421 and 687–689.

*Primary Examiner*—Aaron Weisstuch
*Attorney, Agent, or Firm*—Donald P. Reynolds; Frank H. Jackson; James E. Denny

[57] ABSTRACT

A beam of ions is directed under control onto an insulating surface by supplying simultaneously a stream of electrons directed at the same surface in a quantity sufficient to neutralize the overall electric charge of the ion beam and result in a net zero current flow to the insulating surface. The ion beam is adapted particularly both to the implantation of ions in a uniform areal disposition over the insulating surface and to the sputtering of atoms or molecules of the insulator onto a substrate.

1 Claim, 2 Drawing Figures

METHOD AND MEANS OF DIRECTING AN ION BEAM ONTO AN INSULATING SURFACE FOR ION IMPLANTATION OR SPUTTERING

CONTRACTUAL ORIGIN OF THE INVENTION

The invention described herein was made in the course of, or under, a contract with the U.S. ENERGY RESEARCH AND DEVELOPMENT ADMINISTRATION.

BACKGROUND OF THE INVENTION

This invention relates to the bombardment of surfaces by beams of ions.

Ion bombardment has been widely used in recent years as a method of implanting into a target and of sputtering a deposit of the material of the target onto a substrate. This is usually carried out under vacuum conditions and involves directing a stream of ions at the target. Collisions of the ions with atoms or molecules of the target during implantation impart enough energy to some of these atoms or molecules to free them from the body of the target. They are then directed or attracted to the substrate and deposited on the substrate.

The flow of ions involves not only a transport of mass but also the flow of an electric current. The path of current in an apparatus for sputtering thus involves a complete circuit that includes the source of the beam of ions, the beam itself, the target, and a return through a power supply to the source. Such systems work very successfully when the target is an electrical conductor which thus supplies an equipotential surface upon which the beam of ions impinges. However, several disadvantages become apparent if it is desired to direct such a beam at an insulating target, either for sputtering of atoms or molecules of the insulator onto another surface or to implant ions from the beam into the insulator. An attempt to direct an ion beam onto the surface of an insulator causes a local buildup of charges that repel the beam from the surface of the insulator. Such a beam can be seen to wander about on the surface, resulting in uneven areal implantation of ions and uneven removal of material for sputtering. The wandering occurs because areas that are locally charged repel the beam, causing it to be directed to areas that have accumulated less charge. Sometimes the buildup of charge is sufficiently great to deflect the beam entirely from the target until the charge has leaked away. This results in unsatisfactory operation, either for ion implantation or for sputtering.

It is an object of the present invention to provide a better method and means of sputtering insulating material from a target onto a substrate.

It is a further object of the present invention to provide a better method and means of implanting ions into an insulator.

Other objects will become apparent in the course of a detailed description of the invention.

SUMMARY OF THE INVENTION

Sputtering of an insulating material and implantation of ions into an insulating material from an ion beam are facilitated by directing a flow of electrons at the target in an amount sufficient to equal the current flow in the ion beam. Ions are thereby directed in a controlled uniform beam onto the target for uniform areal implantation. Both implantation into the target and sputtering of material from the target to a substrate are facilitated by the resulting electrical neutralization of the beam.

DETAILED DESCRIPTION OF THE INVENTION

Figure 1:
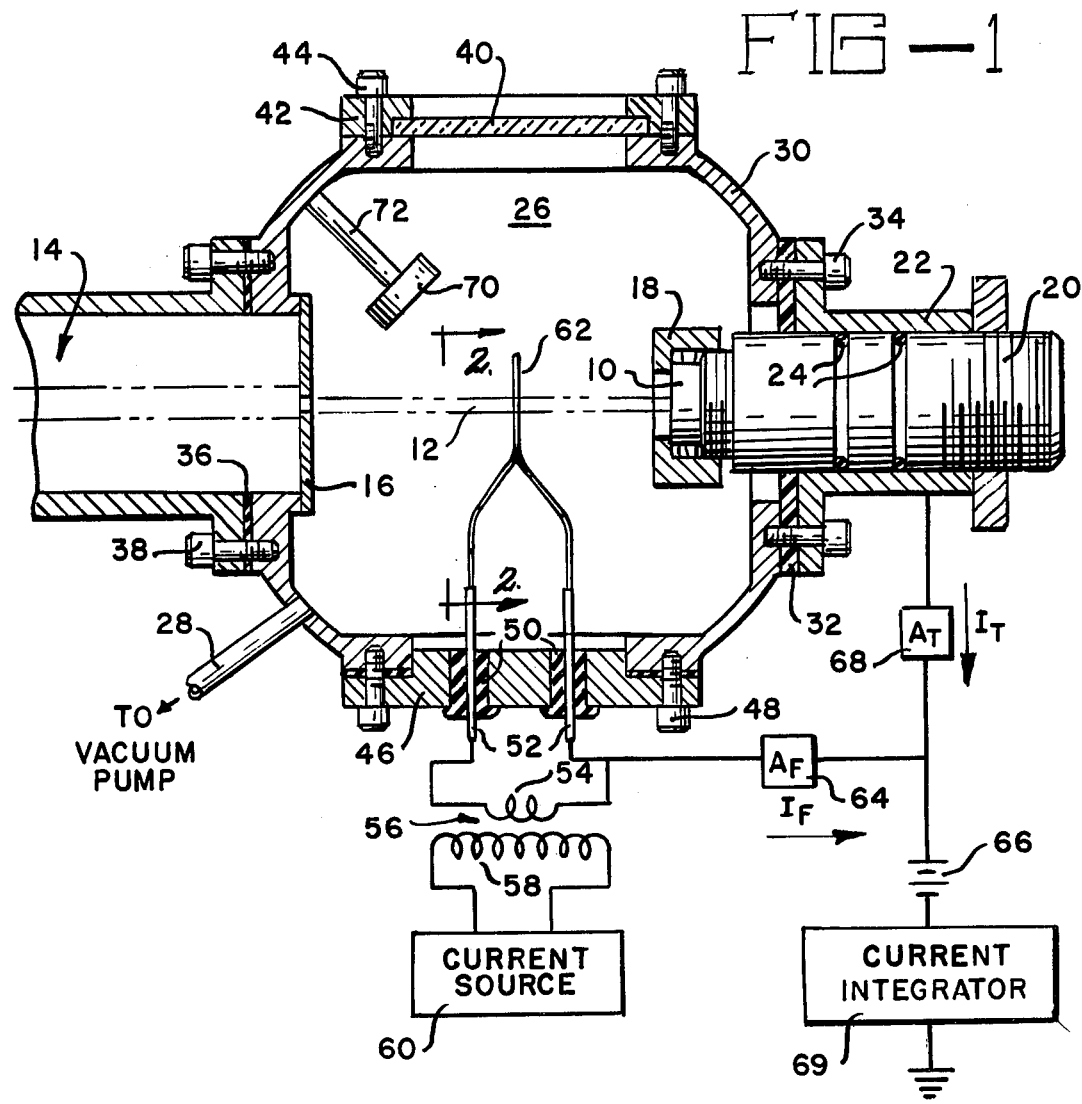
FIG. 1 is a sectional side view of an apparatus for the practice of the present invention.

FIG. 1 is a sectional side view of an apparatus for the practice of the present invention. In FIG. 1, target 10 is an insulating material such as sapphire. Target 10 is placed in a beam 12 of ions that has originated in an ion gun 14 and has been collimated to a desired size by an orifice plate 16. Target 10 is attached by a collar 18 which is placed in threaded engagement with a tube 22. One or more O-rings 24 provide a vacuum seal to help maintain the interior 26 under vacuum conditions provided through line 28 from a vacuum pump. A housing 30 supports tube 22 which is insulated electrically from housing 30 by insulating gasket 32 and insulated bolts 34. Housing 30 will typically be maintained at electrical ground for convenience in operation. Housing 30 is also insulated from ion gun 14 by insulating gasket 36 and is mounted to ion gun 14 by insulated bolts 38.

Housing 30 is equipped with a viewing port 40, a glass plate held in a vacuum seal by flange 42 which in turn is secured by bolts 44. A viewing port 40 is not necessary for the operation of the invention but can be of assistance in letting an operator see the progress of ion implantation or sputtering. An additional flanges 46 is attached to housing 30 by bolts 48. Two feedthroughs 50 maintain a vacuum seal and permit the insulated passage through flange 46 of two electrical leads 52. Outside the flange 46 leads 52 are connected to the secondary winding 54 of a transformer 56 of which the primary winding 58 is connected to a current source 60. In the interior 26 the electrical leads 52 are connected through a filament 62 that will be heated by the passage of current to emit electrons. One of the leads 52 is also connected electrically through an ammeter 64 to a positive terminal of a voltage source 66. The positive terminal is also connected through an ammeter 68 to tube 22. The negative termial of the voltage source 66 is connected to a current integrator 69 and thence to electrical ground which is connected to housing 30. A substrate 70 is mounted by support 72 to housing 30 in one version of the present invention. Support 72 provides an electrical connection to housing 30 that maintains substrate 70 at electrical ground as well as providing physical support and a path for conducting heat. Substrate 70 is shown in FIG. 1 as being cooled by whatever conduction occurs along support 72 and by radiation within interior 26. Under some conditions of operation, it might be desirable to provide additional cooling for substrate 70 by means such as connecting external water tubing through support 72. This is a minor design modification that will not normally be necessary but that would be accomplished readily if the need for cooling became apparent.

Figure 2:
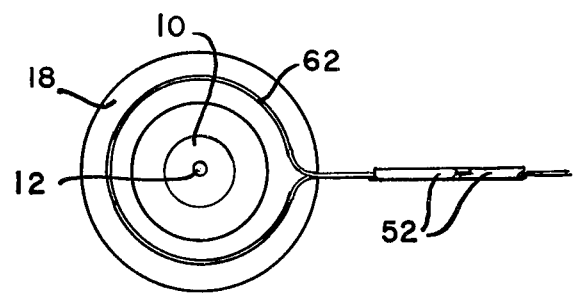
FIG. 2 is a partial sectional end view of the target and electron source of the present invention.

FIG. 2 is a partial sectional view of a portion of the apparatus of FIG. 1 taken along section lines 2—2 of FIG. 1. In FIG. 2, electrical leads 52 are seen to be connected to filament 62 which encloses beam 12. Target 10 is illuminated by beam 12 and is held in place by collar 18.

Operation of the apparatus of FIGS. 1 and 2 is initiated by establishing a vacuum of the order of 0.2 microtorr in interior 26 with the vacuum pump. Ion gun 14 is a commercially obtained source such as a duoplasmatron, only the exit portion of which is shown in FIG. 1 as ion gun 14. The ion gun is operated to generate a beam of ions directed at target 10. If target 10 were an electrical conductor, then its surface would be an equipotential surface that would conduct intercepted charge away readily. In such a case, the present invention would not be necessary. However, where target 10 is an insulator such as sapphire, silica, magnesia, or the like, the incidence of a beam of ions results in a local buildup of electrical charge that is not readily dispersed because of the insulating properties of the material of the target 10. While such a charge buildup will leak away in time, it sets up an opposing potential before it leaks. This opposing potential will direct the ion beam away from the spots of buildup and cause the ion beam to appear to wander about the surface of the crystal. In extreme cases, the charge buildup may be sufficient to deflect the beam entirely from the insulating surface of the target 10 until the charge has leaked sufficiently. If the apparatus is being operated to implant ions from the beam 12 into target 10, then the result of such charge buildup will be an uncontrolled and nonuniform implantation of ions. If the objective is to sputter atoms of the target 10 onto the substrate 70, then the result of such a charge buildup will be to produce uneven sputtering that will be difficult to control. These disadvantages are overcome by connecting current source 60 to filament 62 through transformer 56. Varying the a-c current of current source 60 will vary the degree to which filament 62 is heated and hence will vary the electron emissivity of filament 62. In operation, the level of current source 60 is varied, typically by adjusting a variable autotransformer, until ammeter 68 reads zero current. This means that the amount of electron current emitted by filament 62 and captured by the target 10 and the other elements at its potential are equal to the ion current in beam 12. It is to be expected that most of the electron current from filament 62 will be attracted to target 10 which would otherwise exhibit a buildup of positive charge from the ions in beam 12. When the current in ammeter 68 is adjusted to zero, the ammeter 64 reads the magnitude of the electron current from filament 62 which is thus equal to the ion beam current. The application of the current that flows through ammeter 64 to current integrator 69 provides a measure of the cumulative amount of charge and hence of the number of ions incident upon target 10.

An apparatus for the practice of the present invention has been built and used at the Argonne National Laboratory for the implantation of ions of hydrogen, deuterium, helium, neon and argon into single-crystal sapphire. The targets were ½ inch or ¾ inch in diameter and were either 0.020 or 0.40 inches in thickness. Other targets were sapphire plates 52 mm×20 mm×2 mm. Typical conditions of bombardment were by ion currents of the order of 70 microamperes at 15 keV. Voltage source 66 was set at 45 volts to prevent loss of electron current to the grounded housing 30. Filament 62 could have been made of any good electron emitter but was a thoria-coated iridium filament. Under some conditions of operation, it might be desirable to assist the vacuum pump in maintaining a vacuum by cooling a portion of the housing 30 or a corresponding thermally conducting surface in contact with the interior 26 to provide cryopumping. This is not generally necessary and has been omitted in FIG. 1 for clarity. In operation, the neutralization of current that was provided by the combination of current from filament 62 and the current in beam 12 resulted in a visibly uniform implantation of ions into the insulating target of sapphire and also resulted in an improved control of ion bombardment of the target for sputtering onto a substrate 70.

The embodiments of the invention in which an exclusive property or privilege is claimed are defined as follows:

1. An apparatus for implanting ions in an electrically insulating target comprising:
   a support for holding the target in a vacuum region;
   an ion gun to direct a beam of ions at the target;
   means for maintaining the vacuum in the vacuum region;
   a filament disposed to emit electrons in a direction to reach the target;
   a controllable electrical source connected to the filament for heating the filament;
   means for measuring the flow of electrical current between the filament and the target;
   means for measuring the net electrical current flowing between the target support and electrical ground;
   a voltage source for establishing an electrical bias between the target support and electrical ground; and
   a current integrator for integrating the current between the filament and the target as a function of time.

* * * * *